(12) United States Patent
Mitchell et al.

(10) Patent No.: US 8,347,814 B2
(45) Date of Patent: Jan. 8, 2013

(54) METHOD AND APPARATUS FOR COATING A CURVED SURFACE

(75) Inventors: Daniel B. Mitchell, Port McNicoll (CA); Geoffrey G. Harris, Midland (CA); Douglas J. Brown, Midland (CA)

(73) Assignee: Raytheon Canada Limited, Ottawa, Ontario (CA)

( * ) Notice: Subject to any disclaimer, the term of this patent is extended or adjusted under 35 U.S.C. 154(b) by 1101 days.

(21) Appl. No.: 12/017,909

(22) Filed: Jan. 22, 2008

(65) Prior Publication Data

US 2009/0186159 A1 Jul. 23, 2009

(51) Int. Cl.
*C23C 16/00* (2006.01)
*C23C 16/448* (2006.01)

(52) U.S. Cl. ............ 118/723 VE; 118/723 EB; 118/715

(58) Field of Classification Search ............ 118/723 VE, 118/723 EB, 715
See application file for complete search history.

(56) References Cited

U.S. PATENT DOCUMENTS

| | | | |
|---|---|---|---|
| 2,410,720 A | | 11/1946 | Dimmick |
| 2,411,715 A | | 11/1946 | Dimmick |
| 3,486,237 A | | 12/1969 | Sawicki |
| 3,645,771 A | * | 2/1972 | Ward ............................. 427/10 |
| 4,600,390 A | | 7/1986 | Gobel et al. |
| 4,817,559 A | | 4/1989 | Ciparisso |
| 4,868,003 A | * | 9/1989 | Temple et al. ................. 118/719 |
| 4,982,696 A | * | 1/1991 | Kinoshita et al. ....... 118/723 VE |
| 5,074,246 A | | 12/1991 | Gailliard et al. |
| 5,164,228 A | | 11/1992 | Peralta et al. |
| 6,051,113 A | * | 4/2000 | Moslehi ................... 204/192.12 |
| 6,473,247 B1 | | 10/2002 | Keller et al. |
| 6,632,285 B2 | * | 10/2003 | Wang et al. .................... 118/726 |
| 6,786,176 B2 | * | 9/2004 | Lee et al. .................. 118/723 E |
| 7,062,348 B1 | | 6/2006 | Folta |
| 7,122,223 B1 | | 10/2006 | Comble et al. |
| 7,513,949 B2 | * | 4/2009 | Yamazaki et al. ............ 117/201 |
| 7,696,065 B2 | | 4/2010 | Sato et al. |
| 2001/0005553 A1 | * | 6/2001 | Witzman et al. ............... 428/402 |
| 2002/0003086 A1 | * | 1/2002 | Sferlazzo ................. 204/298.11 |
| 2002/0005347 A1 | * | 1/2002 | Sferlazzo et al. .......... 204/192.1 |
| 2002/0110648 A1 | * | 8/2002 | Lee et al. ...................... 427/569 |
| 2002/0110698 A1 | * | 8/2002 | Singh ............................ 428/472 |

(Continued)

FOREIGN PATENT DOCUMENTS

JP 2003-071650 A 3/2003

OTHER PUBLICATIONS

U.S. Appl. No. 12/101,042, filed Apr. 10, 2008 by inventors Daniel B. Mitchell, Geoffrey G. Harris and Douglas J. Brown for "Method and Apparatus for Coating Surfaces", 18 pages of text, 2 pages of drawings.

(Continued)

*Primary Examiner* — Jeffrie R Lund
(74) *Attorney, Agent, or Firm* — Lando & Anastasi, LLP

(57) ABSTRACT

An apparatus includes a workpiece support, a source that is spaced from the workpiece support and can emit a plume of coating material toward the workpiece support, and plume adjusting structure that, between the source and workpiece support, can influence a plume of material flowing from the source. A different aspect involves a method that includes emitting from a source a plume of coating material that flows toward a workpiece support, and adjusting, between the source and the workpiece support, a plume of material flowing from the source.

7 Claims, 2 Drawing Sheets

U.S. PATENT DOCUMENTS

| | | | |
|---|---|---|---|
| 2002/0162740 A1* | 11/2002 | Wang et al. | 204/298.11 |
| 2003/0072881 A1* | 4/2003 | Yang et al. | 427/255.28 |
| 2003/0077403 A1* | 4/2003 | Darolia et al. | 427/595 |
| 2003/0082300 A1* | 5/2003 | Todd et al. | 427/255.27 |
| 2004/0231594 A1* | 11/2004 | Edwards et al. | 118/719 |
| 2004/0264352 A1 | 12/2004 | Ohya | |
| 2005/0254148 A1 | 11/2005 | Shimizu | |
| 2006/0130760 A1 | 6/2006 | Zultzke et al. | |
| 2007/0155295 A1 | 7/2007 | Igarashi et al. | |
| 2007/0157883 A1* | 7/2007 | Zultzke et al. | 118/715 |
| 2009/0025814 A1 | 1/2009 | Olsson | |
| 2009/0186159 A1* | 7/2009 | Mitchell et al. | 427/421.1 |
| 2009/0258141 A1* | 10/2009 | Mitchell et al. | 427/255.5 |
| 2009/0258151 A1 | 10/2009 | Mitchell et al. | |
| 2009/0280244 A1 | 11/2009 | Mitchell et al. | |
| 2010/0009074 A1* | 1/2010 | Mitchell et al. | 427/162 |

OTHER PUBLICATIONS

U.S. Appl. No. 12/169,971, filed Jul. 9, 2008 by inventors Daniel B. Mitchell, Douglas J. Brown and Geoffrey G. Harris for "Method and Apparatus for Coating Surfaces", 26 pages of text, 3 pages of drawings.

* cited by examiner

METHOD AND APPARATUS FOR COATING A CURVED SURFACE

FIELD OF THE INVENTION

This invention relates in general to techniques for coating surfaces and, more particularly, to techniques for coating curved surfaces.

BACKGROUND

While fabricating optical components such as lenses, it is very common to form a coating on a surface of the component, where the coating provides desired optical or physical properties. For example, the coating may provide an anti-reflective (AR) characteristic, a filtering characteristic, physical protection for the component, some other characteristic, or a combination of two or more characteristics. These coatings often include multiple layers of different materials that collectively provide the desired characteristic(s).

One problem with conventional coating techniques is that any given layer in the coating may have a thickness that is not uniform throughout the layer. For example, where a coating is on a relatively highly curved surface, it is not unusual for a given layer within the coating to have a peripheral region that is as much as 30% to 50% thinner than a central region of that layer, or even more than 50% thinner. Further, different layers in the same coating often have different variations in thickness. For example, one layer may be 30% thinner in a peripheral region than in a central region, while another layer may be 50% thinner in the peripheral region than in the central region. Consequently, the ratios of thicknesses of different layers in the peripheral region can be different from the ratios of the thicknesses of those same layers in the central region.

Thus, even assuming that the layers of a coating all have the proper thicknesses or ratios of thickness in the central region, the thicknesses in the peripheral region will typically not be correct and, moreover, the ratios of thicknesses in the peripheral region will typically not be correct. As a result, the coating may provide the desired characteristics in the central region, but may fail to provide the desired characteristics in the peripheral region, or may at least exhibit a degradation of the desired characteristics in the peripheral region.

BRIEF DESCRIPTION OF THE DRAWINGS

A better understanding of the present invention will be realized from the detailed description that follows, taken in conjunction with the accompanying drawings, in which.

DETAILED DESCRIPTION

Figure 1:
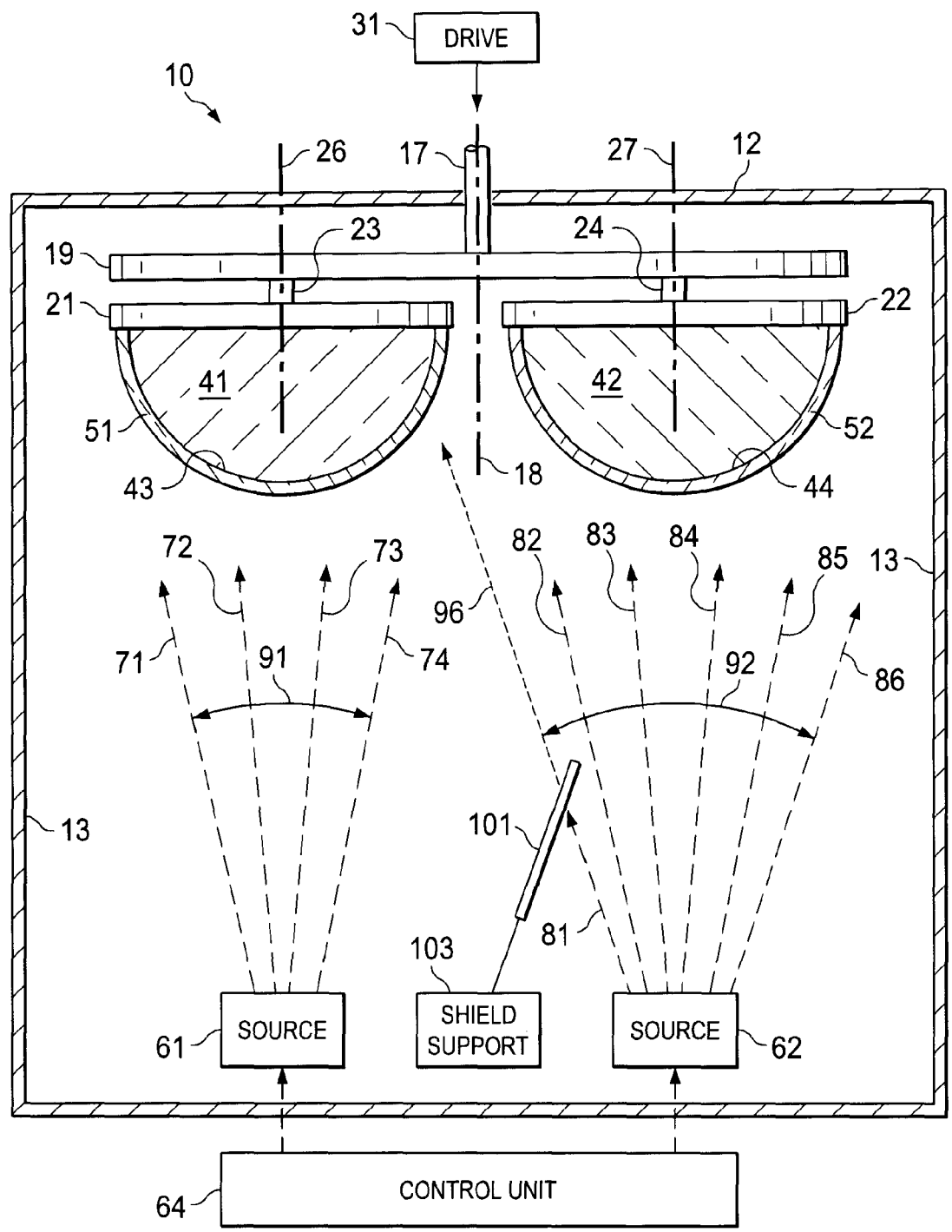
FIG. 1 is a diagrammatic sectional side view of a coating apparatus that embodies aspects of the present invention.

FIG. 1 is a diagrammatic sectional side view of a coating apparatus 10 that embodies aspects of the present invention. The coating apparatus 10 includes a housing 12 with a chamber 13 therein. The housing 12 supports a primary axle 17 for rotation about a primary vertical axis 18. A disk-shaped support part 19 is supported on the axle 17 for rotation with the axle about the axis 18.

The support part 19 rotatably supports two disk-shaped workpiece support members 21 and 22. More specifically, two additional vertical axles 23 and 24 are rotatably supported on the support part 19. These additional axles are spaced circumferentially from each other about the primary axle 17, and each rotate about a respective additional vertical axis 26 or 27. The two support members 21 and 22 are each supported on a respective one of the axles 23 and 24 for rotation therewith about the associated axis 26 or 27. Although FIG. 1 shows two additional axles 23 and 24 and two workpiece support members 21 and 22, it would alternatively be possible to have one or more further workpiece support members that each have an additional axle, wherein all the additional axles are spaced circumferentially from each other about the primary axle 17.

A drive mechanism 31 such as an electric motor is coupled to the axle 17, in order to effect rotation of the axle 17 and the support part 19. A not-illustrated planetary gearing mechanism of a well-known type is provided and, in response to rotation of the support part 19 with respect to the housing 12, effects rotation of the additional axles 23 and 24 with respect to the support part 19. Thus, the workpiece support members 21 and 22 each undergo planetary movement about the primary axis 18 with respect to the housing 12. The primary axle 17, the support part 19, the additional axles 23 and 24, and the workpiece support members 21 and 22 collectively serve as a workpiece support mechanism.

Each of the workpiece support members 21 and 22 is configured to removably support a respective workpiece 41 or 42. The workpieces 41 and 42 each have on the lower side thereof a relatively highly curved surface 43 or 44. The apparatus 10 is used to form respective coatings 51 and 52 on the respective curved surfaces 43 and 44 of the workpieces 41 and 42, in a manner discussed in more detail later. The coating apparatus 10 is not limited to use for coating highly curved surfaces, and in fact can be used to coat surfaces having a variety of different shapes. However, the coating apparatus 10 is very effective when used to coat highly curved surfaces such as those shown at 43 and 44. In the disclosed embodiment, the workpieces 41 and 42 with the coatings 51 and 52 thereon are each an optical component of a type well known in the art, such as a lens. Therefore, they are described here only briefly, to the extent necessary to facilitate an understanding of the structure and operation of the coating apparatus 10. Further, it should be understood that the coating apparatus 10 is not limited to use for coating optical components, but instead can alternatively be used for coating a wide variety of other types of workpieces.

It would be possible for each of the coatings 51 and 52 to be only a single layer of a single material. But in the disclosed embodiment, the coatings 51 and 52 each include a plurality of different layers, involving the use of one material for some layers, another material for other layers, and so forth. By interleaving different layers of different materials in a known manner, the coatings 51 and 52 can each be given certain desired optical characteristics. For example, the coatings 51 and 52 may each be anti-reflective (AR) coatings that provide little or no reflection of a selected range of wavelengths, such as a range corresponding to visible light.

In some cases, the multi-layer coatings 51 and 52 will be configured in a known manner to provide a combination of two or more desired optical characteristics. For example, a given coating may provide an anti-reflection characteristic as to one range of wavelengths, such as visible light, while also filtering out wavelengths in a different range, such as a range associated with laser energy.

As another example, if the optical workpiece 41 or 42 happens to be made of a relatively soft material that was selected because it provides certain desirable optical properties, the coating 51 or 52 thereon may be configured to be physically harder than the associated workpiece 41 or 42, in order to help physically protect the material of the workpiece 41 or 42. Thus, a given coating 51 may provide an anti-reflection characteristic, while also being physically harder than the material of the workpiece 41 or 42, in order to help physically protect the workpiece. The discussion here of anti-reflection characteristics, filtering characteristics and hardness characteristics is merely exemplary. The coatings 51 and 52 may each provide some or all of these characteristics, and/or any of a variety of other characteristics, separately or in combination.

In the multi-layer coatings 51 and 52, the layers may all have the same thicknesses, or some layers may be intentionally thicker than other layers. Ideally, it is desirable that the thickness of each layer be relatively uniform throughout the layer. As a practical matter, that is not always possible. But even if the thickness of a given layer varies somewhat, it is desirable that, as between any two layers, the ratio of their thicknesses remain relatively uniform across the entire surface 33 or 34. The disclosed coating apparatus 10 is configured to achieve good uniformity of the ratios of thicknesses within the coatings 51 and 52.

The apparatus 10 includes two spaced sources 61 and 62 in a lower portion of the housing 12. In the disclosed embodiment, the sources 61 and 62 are each spaced radially from the primary axis 18, and are each positioned approximately below the path of travel of the workpiece support members 21 and 22, at locations spaced circumferentially about the primary axis 18. Alternatively, however, it would be possible for the sources 61 and 62 to be positioned at various other locations within the housing 12. The sources 61 and 62 are each a device of a type well known in the art, and are therefore described only briefly here. In the disclosed embodiment, the sources 61 and 62 are each a device commonly referred to as an electron beam evaporator. However, either or both of the sources 61 and 62 could alternatively be any other suitable type of device. Although FIG. 1 shows two sources 61 and 62, it would alternatively be possible to provide three or more sources in the apparatus 10.

The source 61 contains one material that will be used to form one or more layers in each of the multi-layer coatings 51 and 52, and the source 62 contains a different material that will be used to form one or more other layers in each of the multi-layer coatings 51 and 52. The sources 61 and 62 are both controlled by a control unit 64. Typically, only one of the sources 61 and 62 will be active at any given point in time, but there can be circumstances under which the sources 61 and 62 will both be active at the same time.

The sources 61 and 62 each evaporate the coating material provided therein, so that a plume of the evaporated material travels upwardly, as indicated diagrammatically by arrows 71-74 for the source 61, and by arrows 81-86 for the source 62. It will be noted that the plume 71-74 of material from the source 61 has a flow pattern that is different from the plume 81-86 of material from the source 62. For example, the dispersion angle 91 of the plume 71-74 is less than the dispersion angle 92 of the plume 81-84. This can result from any of various different factors, including differences between the sources 61 and 62, differences in the materials that are being evaporated, or other factors.

The narrower plume 71-74 from the source 61 basically coats the workpieces 41 and 42 as they pass directly above the source 61. In this regard, when one of the workpieces 41 and 42 is above the source 61, and due to the significant curvature of the surfaces 43 or 44 thereon, the plume 71-74 will impinge on the central region of the curved surface approximately perpendicular thereto, but will impinge on the peripheral regions of the curved surface at a relatively steep angle. Consequently, the resulting coating will tend to be thicker in the central region that in the peripheral regions of the highly curved surface.

In contrast, the wider plume 81-86 from the source 62 will exhibit a similar coating effect on highly curved surfaces that are passing above it, but also has the potential to simultaneously coat peripheral edges of other workpieces that are not above it. For example, arrow 81 in FIG. 1 represents a peripheral portion of the plume 81-86, and a broken-line arrow 96 represents a potential path of travel of the evaporated material in this peripheral portion 81 of the plume 81-86. As indicated by arrow 96, in the absence of any preventative measure, the peripheral portion 81 of the plume 81-86 would tend to travel to and be deposited on a peripheral portion of the surface 43 of a workpiece 41 that is not currently above the source 62.

Thus, when source 62 is being used to form a layer in each of the coatings 51 and 52, that layer would potentially receive proportionally more coating material in its peripheral regions than a layer formed by the source 61. Stated differently, a layer formed with the source 61 might have a peripheral region that is 50% thinner than its central region, while a layer formed with the source 62 could potentially have a peripheral region that is only 30% thinner than its central regions. Consequently, in the absence of preventative measures, the various different layers of a coating could all have the desired thicknesses and desired ratios of thicknesses in the central region of the coating, but the same layers could have different ratios of thicknesses in the peripheral regions of the coating. As a result, the central region of the coating could accurately provide desired optical (such as anti-reflection or filtering), whereas peripheral regions of the same coating might fail to provide these optical characteristic, or might provide them with reduced performance.

In order to improve the quality and performance of the coatings 51 and 52, the apparatus 10 in FIG. 1 includes a shield 101 that is supported by a shield support 103. The position of the shield 101 is selected to provide an appropriate degree of influence on a peripheral portion of the plume 81-86 of material from the source 62. In particular, the shield 101 influences a peripheral portion 81 of the plume 81-86, so that this portion 81 of the plume is diverted away from the original path 96 that it otherwise would have followed toward peripheral portions of workpieces that are not located approximately above the source 62. Instead, due to shield 101, the relatively wide plume 81-86 from the source 62 is adjusted so that material therein is limited to coating workpieces that are located approximately above the source 62.

The shield 101 thus serves to avoid an undesired increase in thickness in the peripheral regions of layers formed with the source 62, which in turn results in greater uniformity in the ratios of thicknesses of different layers. As a result, the intended characteristics of the coatings 51 and 52 are significantly more uniform throughout these coatings than would be the case if the shield 101 was not present in the apparatus 10.

Figure 2:
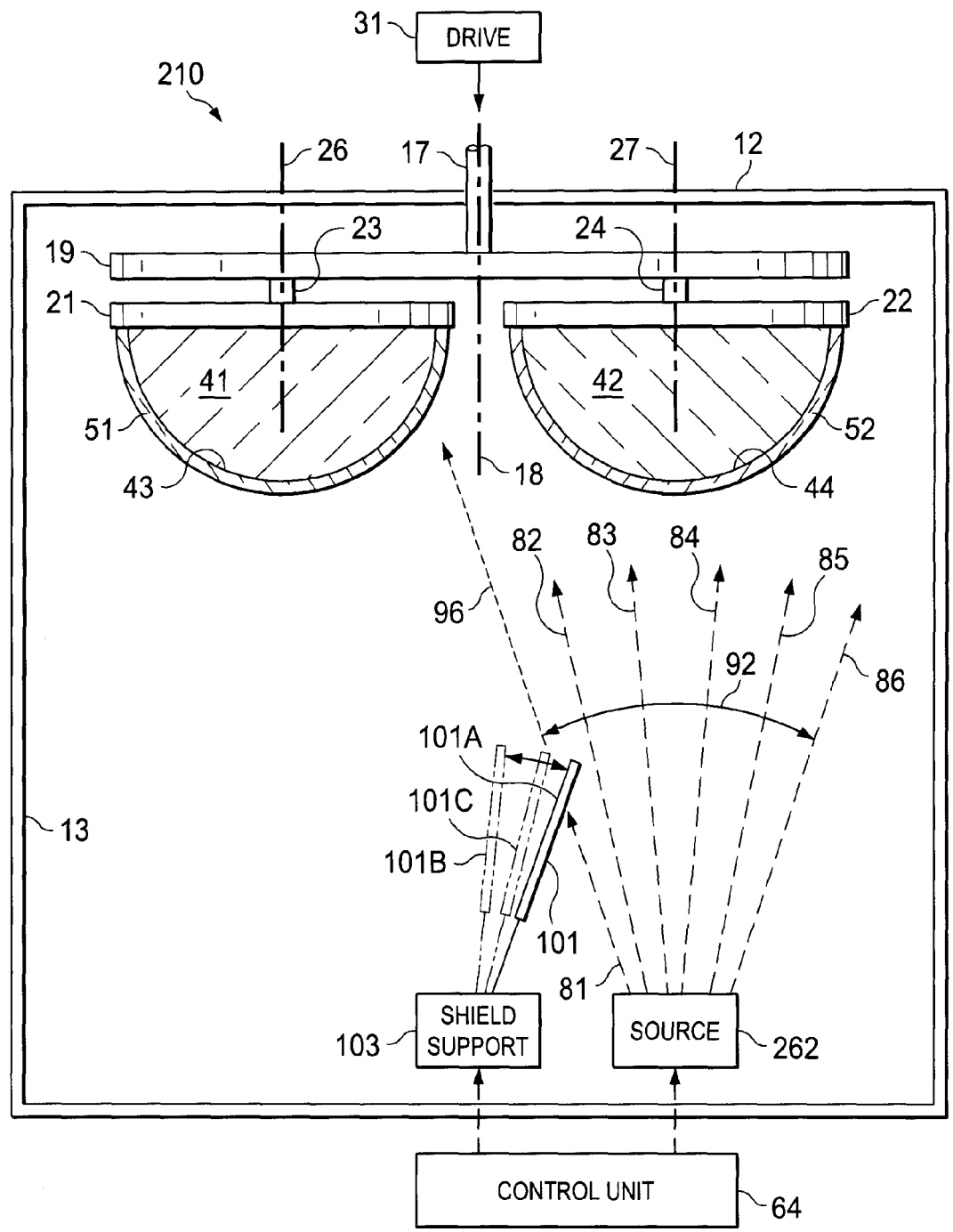
FIG. 2 is a diagrammatic sectional side view of a coating apparatus that is an alternative embodiment of the coating apparatus of FIG. 1, and that embodies aspects of the present invention.

FIG. 2 is a diagrammatic sectional side view of a coating apparatus 210 that is an alternative embodiment of the coating apparatus 10 of FIG. 1, and that embodies aspects of the present invention. In FIG. 2, equivalent parts are identified with the same reference numerals used in FIG. 1, and these parts are not described again in detail here. The following discussion focuses on differences between the apparatus 210 of FIG. 2 and the apparatus 10 of FIG. 1.

The coating apparatus 10 of FIG. 1 includes two separate sources 61 and 62, and each of these sources evaporates a respective different material. In contrast, the coating apparatus 210 of FIG. 2 includes a single source 262. The source 262 is a device of a type well known in the art, and can selectively evaporate any one of two or more different materials. In FIG. 2, the source 262 is shown evaporating the material that produces the plume 81-86, or in other words the same material that was evaporated by the source 62 in FIG. 1. But the source 262 can alternatively evaporate other materials. For example the source 262 contains and can evaporate the same material that was in the source 61 of FIG. 1. Thus, the source 262 can produce the plume 81-86 that is shown in FIG. 2, can alternatively produce a plume that is equivalent to the plume 71-74 in FIG. 1, or can alternatively produce yet another plume of still some other material.

In FIG. 2, the shield support 103 can move the shield 101 between an operational position 101A, a retracted position 101B, and an intermediate position 101C. In the position 101A, the shield 101 influences the plume 81-86 in the manner discussed above in association with FIG. 1. In the retracted position 101B, the shield 101 does not influence the material of any of the various different plumes that the source 262 can generate. In the intermediate position 101C, the shield 101 influences a plume of material emitted by the source 262, other than either of the plumes 71-74 and 81-86. The influence exerted by the shield in position 101C is different than the influence exerted by the shield in position 101A. The movement of the shield 101 between the positions 101A, 101B, and 101C may be effected manually, or may be effected in an automated manner by the shield support 103, under control of the control unit 64.

Although the embodiment of FIG. 2 has only a single source 262 that can selectively evaporate any of two or more different materials, it would alternatively be possible to provide one or more additional sources that can each selectively evaporate one or more different materials. In addition, although the disclosed embodiments are discussed in regard to the formation of coatings on optical components, they can also be alternatively used to form coatings on parts other then optical components.

Although selected embodiments have been illustrated and described in detail, it should be understood that a variety of substitutions and alterations are possible without departing from the spirit and scope of the present invention, as defined by the claims that follow.

What is claimed is:

1. An apparatus comprising:
a workpiece support;
first and second workpiece support members coupled to said workpiece support;
a first source that is spaced from said workpiece support and is configured to selectively emit a first plume of a first coating material that flows away from said first source toward said workpiece support in a first flow pattern;
a second source that is spaced from said workpiece support, said second source being spaced from said first source and being configured to selectively emit a second plume of a second coating material different than said first coating material that flows away from said second source toward said workpiece support in a second flow pattern different from the first flow pattern;
a shield support positioned between said first source and said second source; and a shield movably supported by said shield support;
wherein said workpiece support is supported for rotational movement with respect to said sources about a principle axis that extends approximately parallel to a general direction of said flow of coating materials from said first and second sources;
wherein said first and second workpiece support members are each supported for approximately planetary movement with respect to said sources; and
wherein said shield is movable between a first position in which said shield is free of influence on said second plume of second coating material, and physically influences a peripheral portion of said first plume of first coating material such that said peripheral portion is diverted away from said second workpiece support member and the center portion of said first plume is directed to said first workpiece support, and a second position in which said shield is free of influence on said first plume of first coating material.

2. An apparatus according to claim 1, wherein said first and second workpiece support members are each supported on said support part for rotational movement with respect thereto about a respective secondary axis that is approximately parallel to the principal axis, the secondary axes being circumferentially spaced from each other about the principal axis.

3. An apparatus according to claim 2, wherein said first and second workpiece support members are each configured to support a workpiece having a curved surface oriented to be coated by at least one of said first and second coating materials.

4. An apparatus according to claim 1, wherein said workpiece support is configured to support a curved surface oriented to be coated by at least one of said first and second coating materials.

5. An apparatus according to claim 1, wherein said first source includes first evaporation structure that generates said first plume of first coating material through use of an evaporation technique.

6. An apparatus according to claim 5, wherein said second source includes second evaporation structure that generates said second plume of second coating material through use of an evaporation technique.

7. An apparatus according to claim 6, wherein said at least one of said first and second evaporation structures includes an electron beam evaporator.

* * * * *